(12) United States Patent
Li et al.

(10) Patent No.: US 10,312,914 B2
(45) Date of Patent: Jun. 4, 2019

(54) GATE DRIVER WITH SERIAL COMMUNICATION

(71) Applicant: TEXAS INSTRUMENTS INCORPORATED, Dallas, TX (US)

(72) Inventors: Xiong Li, Allen, TX (US); Toru Tanaka, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/854,515

(22) Filed: Dec. 26, 2017

(65) Prior Publication Data

US 2018/0343009 A1 Nov. 29, 2018

Related U.S. Application Data

(60) Provisional application No. 62/510,066, filed on May 23, 2017.

(51) Int. Cl.
| | |
|---|---|
| *H03K 19/0952* | (2006.01) |
| *H02M 7/537* | (2006.01) |
| *H03K 19/017* | (2006.01) |
| *H03K 17/22* | (2006.01) |
| *H03K 5/19* | (2006.01) |
| *H03K 17/06* | (2006.01) |

(52) U.S. Cl.
CPC ........ *H03K 19/0952* (2013.01); *H02M 7/537* (2013.01); *H03K 5/19* (2013.01); *H03K 17/063* (2013.01); *H03K 17/223* (2013.01); *H03K 19/01707* (2013.01)

(58) Field of Classification Search
None
See application file for complete search history.

(56) References Cited

U.S. PATENT DOCUMENTS

| 5,835,785 | A | * | 11/1998 | Overtoom | G06F 13/4291 |
| | | | | | 710/14 |
| 9,490,689 | B2 | * | 11/2016 | Chambon | H02M 1/0845 |
| 9,490,711 | B2 | * | 11/2016 | Klesyk | H02M 1/08 |
| 2011/0310644 | A1 | * | 12/2011 | Ogura | H02M 1/32 |
| | | | | | 363/55 |
| 2016/0099665 | A1 | * | 4/2016 | Chen | H02M 1/08 |
| | | | | | 318/400.27 |
| 2017/0334294 | A1 | * | 11/2017 | Chen | B60L 3/04 |
| 2017/0349053 | A1 | * | 12/2017 | Landseadel | H02M 1/088 |

* cited by examiner

*Primary Examiner* — Cassandra F Cox
(74) *Attorney, Agent, or Firm* — Tuenlap Chen; Charles A. Brill; Frank D. Cimino

(57) ABSTRACT

A gate driver includes a drive signal input terminal, a drive signal output terminal, a gate drive circuit, and a serial communication interface. The drive signal input terminal is configured to receive a gate drive signal. The gate drive circuit is coupled to the drive signal input terminal and the drive signal output terminal. The gate drive circuit is configured to provide the gate drive signal to the drive signal output terminal. The serial communication interface is coupled to the drive signal input terminal.

19 Claims, 3 Drawing Sheets

GATE DRIVER WITH SERIAL COMMUNICATION

CROSS-REFERENCE TO RELATED APPLICATIONS

The present application claims priority to U.S. Provisional Patent Application No. 62/510,066, filed May 23, 2017, titled "Address Oriented SPI Communication Scheme to Solve the Dilemma Between Data Throughput and Hardware Resources," which is hereby incorporated herein by reference in its entirety.

BACKGROUND

In order to reduce switching losses in power transistors, the power transistors are switched on and off very rapidly. Because the power transistors control terminal may present significant capacitance, a gate driver circuit may be employed to buffer an input signal and drive the power transistor's control terminal. The gate driver circuit receives a low-power input signal and buffers the input signal to produce a high-current signal that quickly charges or discharges the input capacitance of the power transistor. Examples of power transistors with which a gate driver circuit may be employed include insulated gate bipolar transistors and metal oxide semiconductor field-effect-transistors.

SUMMARY

A gate driver that includes addressable serial communication is disclosed herein. In one example, a gate driver includes a drive signal input terminal, a drive signal output terminal, a gate drive circuit, and a serial communication interface. The drive signal input terminal is configured to receive a gate drive signal. The gate drive circuit is coupled to the drive signal input terminal and the drive signal output terminal. The gate drive circuit is configured to provide the gate drive signal to the drive signal output terminal. The serial communication interface is coupled to the drive signal input terminal.

In another example, a motor drive circuit includes plurality of power transistors and a plurality of gate drivers. The power transistors are configured to drive an electric motor. One of the gate drivers is connected to a control terminal of each of the power transistors. Each of the gate drivers includes a drive signal input terminal, a gate drive circuit, and a serial communication interface. The gate drive circuit is coupled to the drive signal input terminal. The gate drive circuit is configured to drive a signal received at the drive signal input terminal onto a control terminal of the one of the power transistors connected to the gate driver. The serial communication interface is coupled to the gate drive circuit. The serial communication interface includes a data input terminal and control circuitry. The control circuitry is configured to enter an address initialization mode during initialization of the gate driver, and to remain in the address initialization mode until the signal received at the drive signal input terminal is activated and thereafter inactivated.

In a further example, a traction inverter includes a plurality of power transistors, a plurality of gate drivers, and a controller. The power transistors are configured to drive an electric motor. Each of the gate drivers is connected to a control terminal of one of the power transistors. The controller includes a plurality of motor drive terminals. Each of the motor drive terminals is connected to a drive signal input terminal of one of the gate drivers. Each of the gate drivers includes a serial communication interface coupled to the controller. The serial communication interface includes a data input terminal, and control circuitry. The control circuitry is configured to enter an address initialization mode during initialization of the gate driver, and to remain in the address initialization mode until the signal received at the drive signal input terminal is activated and thereafter inactivated. While in the address initialization mode, the control circuitry is configured to assign a value received via the data input terminal to be an address of the serial communication interface.

BRIEF DESCRIPTION OF THE DRAWINGS

For a detailed description of various examples, reference will now be made to the accompanying drawings in which:

FIG. 3 shows a block diagram for a gate driver that includes an addressable serial interface in accordance with various examples;

FIG. 4 shows a flow diagram for a method for operating a serial communication interface of a gate driver in accordance with various examples.

DETAILED DESCRIPTION

Figure 1:
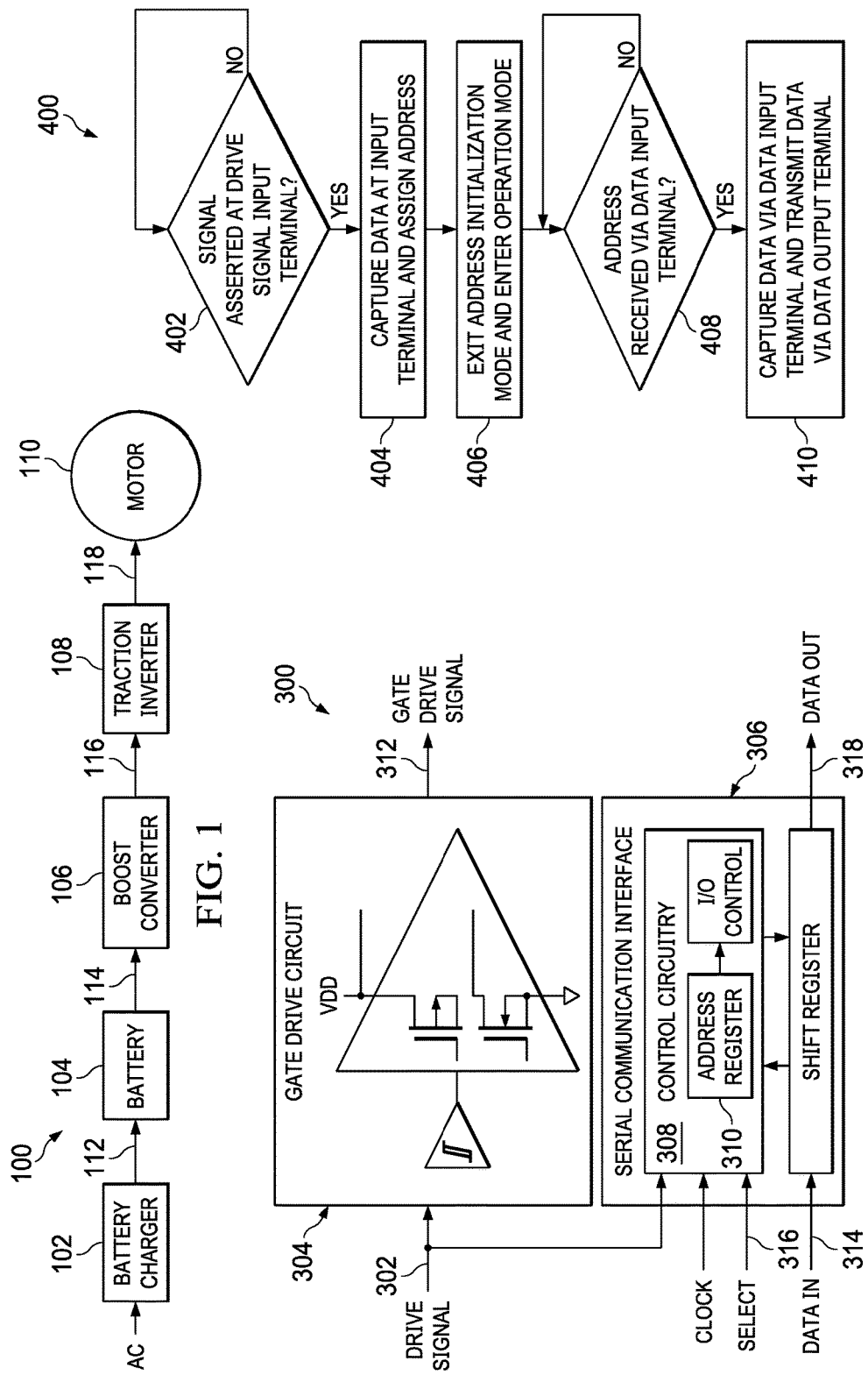
FIG. 1 shows a block diagram for power electronics of an electric or hybrid electric vehicle in accordance with various examples.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Power electronics, including power transistors, are used in a wide variety of applications. Electric vehicles and/or hybrid electric vehicles are applications that make significant use of high voltage power electronics. For example, vehicle power electronics may include a three-phase rectifier, a boost converter, and a traction inverter. The three-phase rectifier converts alternating current (AC) power from a power main to direct current (DC) power to charge the vehicle's battery. The boost converter boosts the battery voltage. The traction inverter converts the DC power provided by the boost converter and/or the vehicle's battery to AC power to generate rotating magnetic field in a motor that drives the vehicles wheels. Silicon or silicon carbide metal oxide semiconductor field effects transistors (MOSFETs)

may be used for the rectifier and/or boost converter. Insulated gate bipolar transistors (IGBTs) may be used in the traction inverter.

Each of the rectifier, boost converter, and traction inverter may include a gate driver to drive each power transistor. Reliable operation of the gate driver ensures the torque safety of the electric power train. The gate drivers disclosed herein include a serial interface to enable communication between gate driver and a controller. The serial interface may be used to implement monitoring, diagnosis, and configuration of the gate drivers.

Serial peripheral interface (SPI) is a type of serial communication that may be applied in gate drivers. SPI is a synchronous serial communication system. Each device implementing SPI includes a data input terminal, a data output terminal, a clock terminal, and one or more select terminals. An SPI master device drives a clock signal onto its clock terminal, drives output data onto its data output terminal synchronous with the clock, and samples data on its data input terminal synchronous with the clock. The SPI master activates a select signal on a select terminal to choose a slave for communication. An SPI slave device receiving the activated select signal on its select terminal receives a clock signal on its clock terminal, drives output data onto its data output terminal synchronous with the clock, and samples data on its data input terminal synchronous with the clock.

Devices communicating via SPI may be arranged in parallel or daisy-chained configurations. In the parallel configuration, a separate select signal is provided for each slave device while the data lines and clock signal are shared by all slave devices. The parallel configuration provides high data throughput, but requires that the master device include a select terminal for each slave device, thus requiring a large number of terminals in some applications. For example, in an electric vehicle with a six-phase traction inverter, more than 15 select terminals may be needed, which may not be readily available in commercial microcontroller units. In the daisy chain configuration, the select signal and clock signal are shared by all slave devices while the data lines are looped in series. The daisy chain configuration allows for a reduced number of terminals on the master device, but limits communication bandwidth to $f_{BW}/N$, where $f_{BW}$ is the SPI clock frequency and N is the number of slave devices.

In implementations of the present disclosure, a full duplex serial communication interface, such as SPI, is included in a gate driver circuit. The serial communication interface includes an address initialization mode. While operating in the address initialization mode the serial communication interface applies a signal received at a drive signal input terminal of the gate driver as a select signal to enable capture of an address value. Any number of serial communication interfaces may be connected to a master device, with data input terminals of all slave devices connected, data output terminals of all slave devices connected, clock terminals of all slave devices connected, and select terminals of all slave devices connected, thereby reducing the number of terminals required on the master device. After assignment of an address to the serial communication interface, the serial communication interface captures data received via its data input terminal and transmits data via its data output terminal only if a signal at its select terminal is activated and the address assigned to the serial communication interface has been received via the data input terminal.

FIG. 1 shows a block diagram for power electronics 100 of an electric vehicle or hybrid-electric vehicle. The power electronics 100 include a battery charger 102, a battery 104, a boost converter 106, a traction inverter 108, and a motor 110. The battery charger 102 receives AC power from the power mains and converts the AC power to DC power 112 that is used to charge the battery 104. The AC power may be three-phase in some implementations. The battery charger 102 includes rectification circuitry to convert the AC power to DC power. The rectification circuity may include silicon or silicon carbide MOSFETs and control circuitry coupled to the MOSFETs to perform the rectification.

The battery 104 may include any number of rechargeable battery cells (e.g., lithium-ion battery cells) connected to provide an output voltage suitable for driving the boost converter 106.

Output 114 of the battery 104 is provided to the boost converter 106. The boost converter 106 is a switch-mode DC-DC converter that boosts the battery output 114 to a voltage suitable for driving the motor 110. For example, the output voltage 116 of the boost converter 106 may be greater than 100 volts. The boost converter 106 may include silicon or silicon carbide MOSFETs as switches to enable generation of the boosted DC voltage.

The traction inverter 108 is a motor drive circuit that receives the output 116 of the boost converter 106 and generates AC signals 118 to drive the motor 110. In various implementations, the traction inverter 108 can be a three-phase inverter, a six-phase inverter, and/or other multi-phase inverters. The signals 118 generated by the traction inverter 108 may cause the motor 110 to rotate the wheels of an electric or hybrid-electric vehicle.

Figure 2:
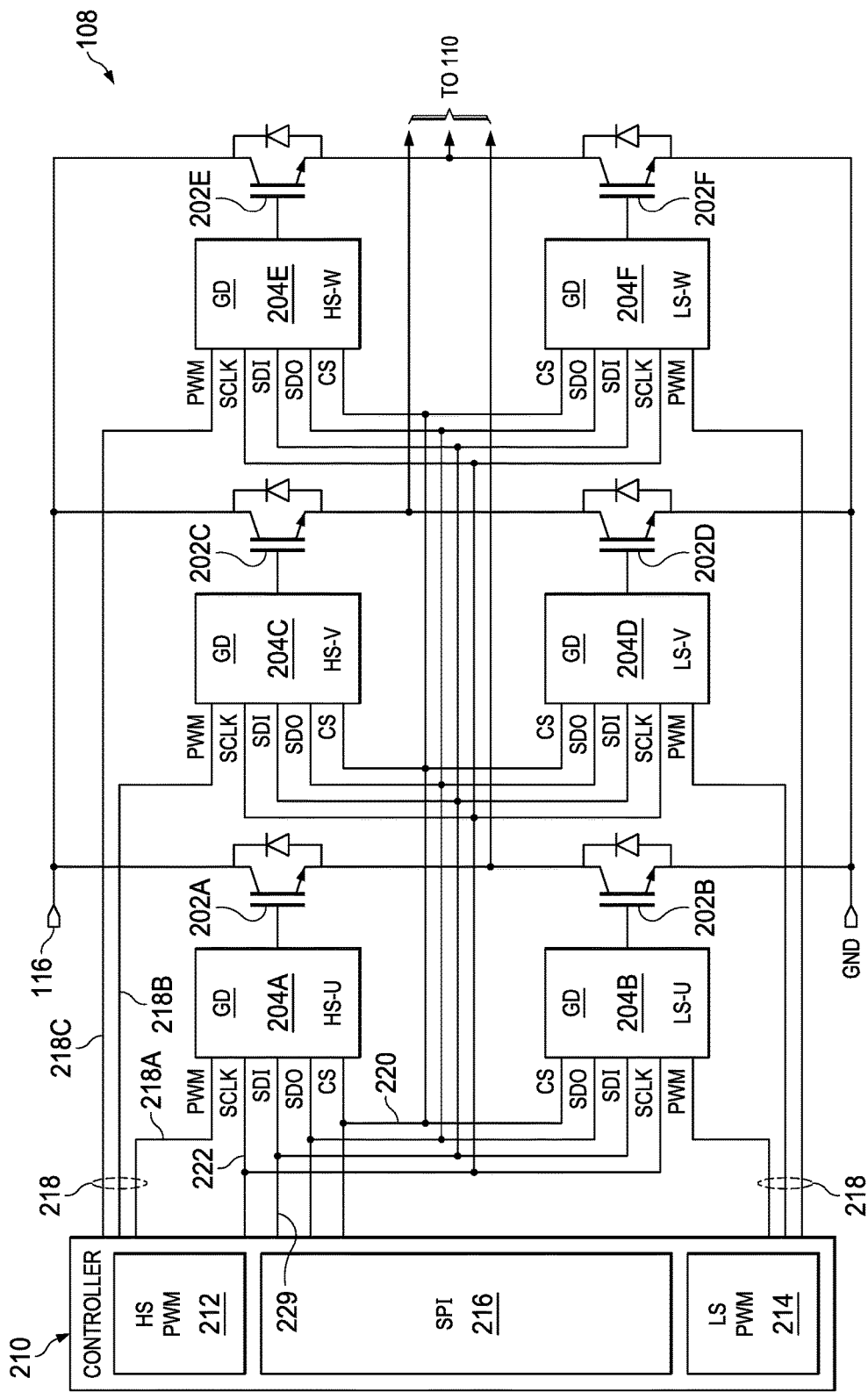
FIG. 2 shows a schematic diagram for a traction inverter in accordance with various examples.

FIG. 2 shows a schematic diagram for the traction inverter 108. The traction inverter 108 includes power transistors 202A, 202B, 202C, 202D, 202E and 202F, a plurality of gate drivers (also referred to as "gate drivers") 204A, 204B, 204C, 204D, 204E and 204F, and a controller 210. The power transistors 202A, 202B, 202C, 202D, 202E and 202F may be identical and the gate drivers 204A, 204B, 204C, 204D, 204E and 204F may be identical. The high-side power transistors 202A, 202C, and 202E are coupled to output 116 provided by the boost converter 106. The low-side power transistors 202B, 202D, and 202F are connected to ground or other reference voltage. The power transistors 202A-202F may be insulated gate bipolar transistors (IGBTs). The power transistors 202A and 202B produce a combined output to drive a first phase of the motor 110. The power transistors 202C and 202D produce a combined output to drive a second phase of the motor 110. The power transistors 202E and 202F produce a combined output to drive a third phase of the motor 110.

Each of the power transistors 202A-202F is connected to and driven by one of the gate drivers 204A-204F. More specifically, the gate driver 204A drives the control terminal (the gate) of the power transistor 202A, the gate driver 204B drives the control terminal of the power transistor 202B, the gate driver 204C drives the control terminal of the power transistor 202C, the gate driver 204D drives the control terminal of the power transistor 202D, the gate driver 204E drives the control terminal of the power transistor 202E, and the gate driver 204F drives the control terminal of the power transistor 202F.

The gate drivers 204A-204F are coupled to the controller 210. The controller 210 may be a microcontroller or other instruction execution machine. The controller 210 includes a high-side pulse width modulator 212, a low-side pulse width modulator 214, and a serial communication interface 216. The controller 210 may also include other components and systems that have been omitted in the interest of clarity. For example, the controller 210 may include an instruction execution unit, memory for program and data storage, timing peripherals, communication peripherals, etc. The high-side pulse width modulator 212 is coupled to the high-side power transistors 202A, 202C, and 202E. The low-side pulse width modulator 214 is coupled to the low-side power transistors 202B, 202D, and 202F. Drive signals generated by the high-side pulse width modulator 212 and the low-side pulse width modulator 214 are provided to the gate drivers 204A-204F to be driven onto the control terminals of the power transistors 202A-202F. The controller 210 includes a plurality of motor drive terminals 218 via which the outputs of the high-side pulse width modulator 212 and the low-side pulse width modulator 214 are provided to the gate drivers 204A-204F.

The serial communication interface 216 may be an SPI master interface. The serial communication interface 216 generates a clock signal, an output data signal, and a select signal that are provided to the gate drivers 204A-204F. The serial communication interface 216 receives an input data signal from the gate drivers 204A-204F. The gate drivers 204A-204F are connected in parallel with respect to the clock signal, the output data signal, the input data signal, and the select signal.

FIG. 3 shows a block diagram for a gate driver 300 that includes an addressable serial interface in accordance with various examples. The gate drivers 204A-204F may be implementations of the gate driver 300. The gate driver 300 includes a drive signal input terminal 302, a gate drive circuit 304, a serial communication interface 306, a drive data output terminal 312, a data input terminal 314, and a select terminal 316. The gate drive circuit 304 receives as input a signal to be driven onto the control terminal of a power transistor. For example, with respect to the traction inverter 108, the gate drive circuit 304 may receive an output of the high-side pulse width modulator 212 to be driven onto a control terminal of one of the power transistors 202A-202F. The gate drive circuit 304 may include a level converter and/or amplifier to increase the voltage and/or current of the signal driven onto the control terminal of the power transistor.

The serial communication interface 306 may be an SPI slave interface. The serial communication interface 306 includes control circuitry 308. The serial communication interface 306 may also include other components and systems that have been omitted in the interest of clarity. For example, the serial communication interface 306 may include a serial data input register that converts received serial data to parallel form, and a serial data output register that converts parallel data to serial form for transmission. The serial communication interface 306 receives the clock signal generated by the controller 210, receives, via the select terminal 316, the select signal generated by the controller 210, and receives, via the data input terminal 314, the input data signal generated by the controller 210. When connected as illustrated in FIG. 2, the gate driver 300 provides improved bandwidth relative to a daisy-chained configuration, and allows for a lower number in input/output terminals on the controller 210 relative to parallel configurations. The gate driver 300 provides these advantages by allowing an address value to be assigned to the serial communication interface 306. Accordingly, the control circuitry 308 includes an address register 310.

During initialization of the gate driver 300, the serial communication interface 306 enters an address initialization mode. While in the address initialization mode, in order to allow the controller 210 to select each instance of the gate driver 300 for address assignment, the gate driver 300 applies the drive signal received via the drive signal input terminal 302 as a select signal. When the drive signal received via the drive signal input terminal 302 is activated, the serial communication interface 306 captures the address value received via the data input terminal 314 and stores the address value in the address register 310. After the address has been assigned, the gate driver 300 transitions from the address initialization mode to an operation mode. In the operation mode, the drive signal received via the drive signal input terminal 302 is not applied to control the serial communication interface 306. Rather, the control circuitry 308 captures an address value received via the data input terminal 314 to determine whether the serial communication interface 306 is to receive and transmit data, and the drive signal received via the drive signal input terminal 302 is amplified and provided to a connected power transistor.

FIG. 4 shows a flow diagram for a method 400 for operating a serial communication interface of a gate driver in accordance with various examples. Though depicted sequentially as a matter of convenience, at least some of the actions shown can be performed in a different order and/or performed in parallel. Additionally, some implementations may perform only some of the actions shown. In some implementations, at least some of the operations of the method 400 can be implemented by the gate driver 300.

In step 402, the gate driver 300 is initializing. For example, power has been applied to the gate driver 300, and the gate driver 300 is in a power up initialization state. The serial communication interface 306 is in address initialization mode. In address initialization mode, the serial communication interface 306 applies the drive signal received via the drive signal input terminal 302 as a select signal to determine whether the serial communication interface 306 is to apply a data value received via the data input terminal 314 as an address. For example, control circuitry 308 may include logic circuits that, in the address initialization mode, enable receipt of an address value only if the drive signal received via the drive signal input terminal 302 is activated. If the drive signal received via the drive signal input terminal 302 is activated, then the control circuitry 308 determines that the serial communication interface 306 is being selected to receive an address value. If the drive signal received via the drive signal input terminal 302 is not activated, then the control circuitry 308 continues to monitor for activation of the drive signal received via the drive signal input terminal 302.

In step 404, responsive to the determination, in block 402, that the drive signal received via the drive signal input terminal 302 is activated, the serial communication interface 306 captures the data value received via the data input terminal 314 and stores the captured data value in the address register 310. The drive signal received via the drive signal input terminal 302 is inactivated (e.g., signal 218A is inactivated by the high-side pulse width modulator 212) when transmission of the address value is complete.

In step 06, responsive to assignment of the address to the serial communication interface 306 in block 404, the serial communication interface 306 exits the address initialization mode and enters operation mode. In some implementations of the gate driver 300, the serial communication interface 306 may also receive of an instruction via the data input terminal 314 (e.g., an enter operation mode instruction transmitted using a broadcast address) to transition into operation mode.

In step 408, the gate driver 300 is in operation mode and the serial communication interface 306 is monitoring the data input terminal 314 for receipt of an address. Activation of a signal at the select terminal 316 (i.e. a select signal) indicates that data is being transferred. Accordingly, activation of the selection signal may activate circuitry that enables the serial communication interface 306 to capture data bits present on the data input terminal 314 at edges of the clock signal 222. For example, a first N bits captured after activation of the select signal may specify an address. If an address is received, the serial communication interface 306 compares the received address to the address value stored in the address register 310 to determine whether subsequently received data is directed to the serial communication interface 306 and the serial communication interface 306 is to drive the data output terminal 318. If the received address matches the address stored in the address register 310, then in step 410, the serial communication interface 306 captures and applies data received via the data input terminal 314 and transmits data to the controller 210 via the data output terminal 318.

Figure 5:
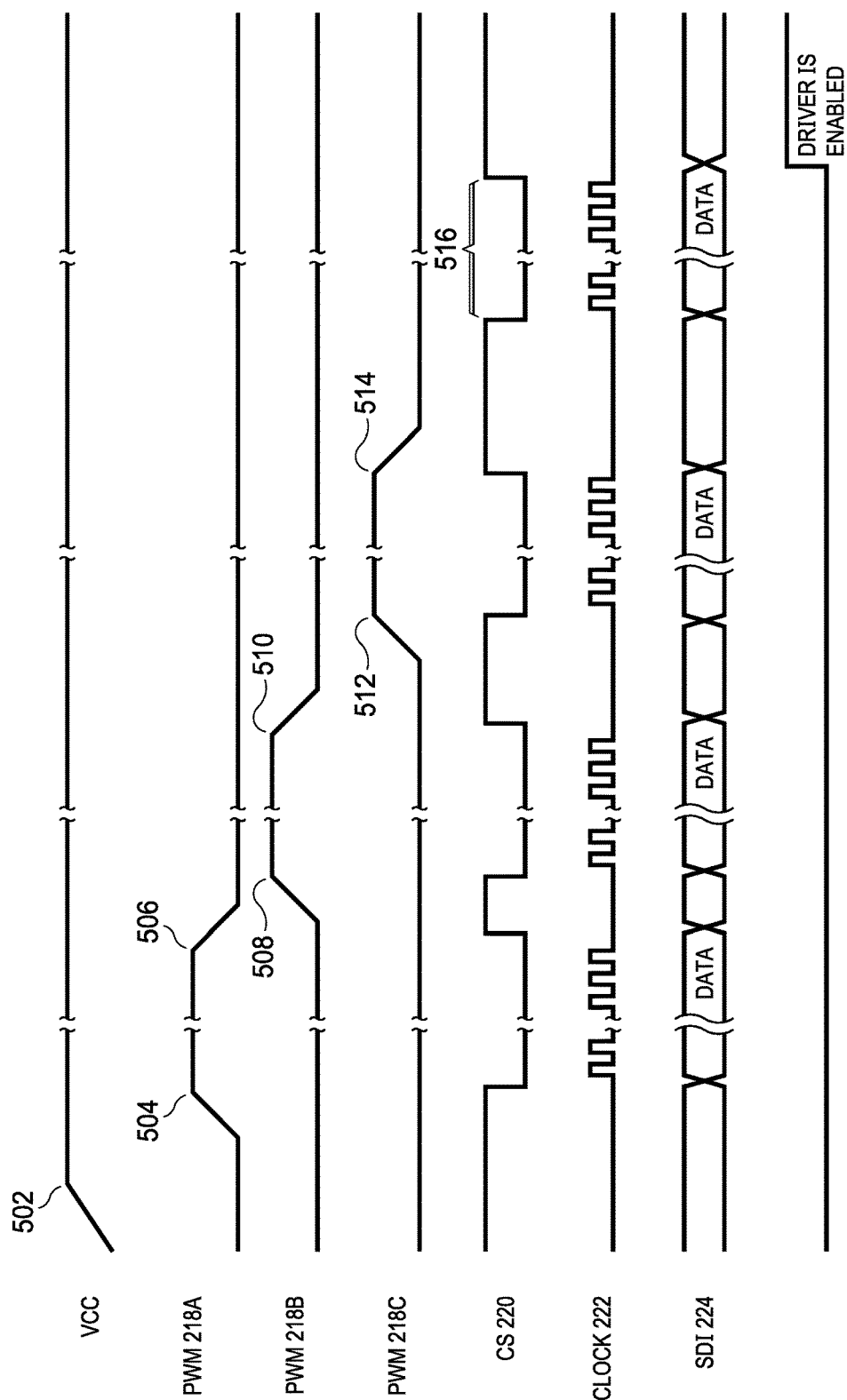
FIG. 5 shows a timing diagram for address assignment in a serial communication interface of a gate driver in accordance with various examples.

FIG. 5 shows a timing diagram for address assignment in a serial communication interface of a gate drivers 204A-204F in accordance with various examples. At 502, power is applied to the gate drivers 204A-204F and the gate drivers 204A-204F enter address initialization mode. At 504, the controller 210 activates the drive signal 218A and the select signal 220. While the drive signal 218A and the select signal 220 are activated, the controller 210 drives the clock signal 222 and drives a data value onto the data input terminal of the gate driver 204A. The gate driver 204A is monitoring the drive signal 218A and select signal 220, and on recognition of the activation of the drive signal 218A and the select signal 220, the gate driver 204A applies the clock signal 222 to capture the data value on the data input terminal and assign the captured data value to be the address of the gate driver 204A. When transmission of the data value onto the data input terminal is complete, the controller 210 inactivates the drive signal 218A and the select signal 220 at 506. When the drive signal 218A and the select signal 220 are inactivated the gate driver 204A may transition from address initialization mode to operation mode.

At 508, the controller 210 activates the drive signal 218B and the select signal 220. While the 218B and the select signal 220 are activated, the controller 210 drives the clock signal clock signal 222 and drives a data value onto the data input terminal of the gate driver 204C. The gate driver 204C is monitoring the 218B and select signal 220, and on recognition of the activation of the 218B and the select signal 220, the gate driver 204C applies the clock signal 222 to capture the data value on the data input terminal and assign the captured data value to be the address of the gate driver 204C. When transmission of the data value onto the data input terminal is complete, the controller 210 inactivates the 218B and the select signal 220 at 510. When the drive signal 218B and the select signal 220 are inactivated the gate driver 204C may transition from address initialization mode to operation mode.

At 512, the controller 210 activates the drive signal 218C and the select signal 220. While the drive signal 218C and the select signal 220 are activated, the controller 210 drives the clock signal clock signal 222 and drives a data value onto the data input terminal of the 204E. The gate driver 204E is monitoring the drive signal 218C and select signal 220, and on recognition of the activation of the drive signal 218B and the select signal 220, the gate driver 204E applies the clock signal 222 to capture the data value on the data input terminal and assign the captured data value to be the address of the gate driver 204E. When transmission of the data value onto the data input terminal is complete, the controller 210 inactivates the drive signal 218C and the select signal 220 at 514. When the drive signal 218C and the select signal 220 are inactivated the gate driver 204E may transition from address initialization mode to operation mode.

The controller 210 continues the process described above to assign address values to the gate drivers 204B, 204D, and 204F. On completion of address assignments, the controller 210 may broadcast an instruction in interval 516 that causes the gate drivers 204A-204F to transition from the address initialization mode to the operation mode and/or to enable output to the power transistors 202A-202F.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A gate driver, comprising:
   a drive signal input terminal configured to receive a gate drive signal;
   a drive signal output terminal;
   a gate drive circuit coupled to the drive signal input terminal and the drive signal output terminal, the gate drive circuit configured to provide the gate drive signal to the drive signal output port; and
   a serial communication interface coupled to the drive signal input terminal,
   wherein:
   the gate drive circuit is configured to amplify the gate drive signal; and
   the serial communication interface comprises:
      a data input terminal; and
      control circuitry configured to assign a value received via the data input terminal to be an address of the serial communication interface responsive to activation of the gate drive signal.

2. The gate driver of claim 1, wherein the control circuitry is configured to enter an address initialization mode and remain in the address initialization mode until the gate drive signal is activated and thereafter deactivated.

3. The gate driver of claim 2, wherein the control circuitry is configured to:
   transition from the address initialization mode to an operation mode responsive to assignment of the address; and
   enable operation of the serial communication interface responsive to receipt, via the data input terminal, of an address value that matches the address assigned to the serial communication interface.

4. The gate driver of claim 1, wherein the control circuitry is configured to apply the gate drive signal to enable operation of the serial communication interface during the address initialization mode.

5. The gate driver of claim 4, wherein the control circuitry is configured to apply the signal at the select terminal in conjunction with the gate drive signal to enable operation of the serial communication interface while the serial communication interface is in the address initialization mode.

6. The gate driver of claim 1, wherein the serial communication interface comprises a select terminal, and the control circuitry is configured to apply a signal at the select terminal to enable operation of the serial communication interface after the address is assigned to the serial communication interface.

7. A motor drive circuit, comprising:
a plurality of power transistors configured to drive an electric motor; and
a plurality of gate drivers, one of the gate drivers connected to a control terminal of each of the power transistors, each of the gate drivers comprising:
a drive signal input terminal;
a gate drive circuit coupled to the drive signal input terminal, the gate drive circuit configured to drive a signal received at the drive signal input terminal to the control terminal of the one of the power transistors connected to the gate driver;
a serial communication interface coupled to the gate drive circuit, the serial communication interface comprising:
a data input terminal; and
control circuitry configured to:
enter an address initialization mode during initialization of the gate driver; and
remain in the address initialization mode until the signal received at the drive signal input terminal is activated and thereafter deactivated.

8. The motor drive circuit of claim 7, wherein the control circuitry is configured to assign a value received via the data input terminal to be an address of the serial communication interface responsive to the activation of a signal at the drive signal input terminal.

9. The motor drive circuit of claim 8, wherein the control circuitry is configured to transition from the address initialization mode to an operation mode responsive to assignment of the address.

10. The motor drive circuit of claim 9, wherein the control circuitry is configured to enable operation of the serial communication interface responsive to receipt, via the data input terminal, of an address value that matches the address assigned to the serial communication interface.

11. The motor drive circuit of claim 7, wherein the control circuitry is configured to apply the signal at the drive signal input terminal to enable operation of the serial communication interface during the address initialization mode.

12. The motor drive circuit of claim 7, wherein the serial communication interface comprises a select terminal, and the control circuitry is configured to apply the signal at the select terminal to enable operation of the serial communication interface after termination of the address initialization mode.

13. The motor drive circuit of claim 7, wherein the control circuitry is configured to apply the signal at the select terminal in conjunction with the signal at the drive signal input terminal to enable operation of the serial communication interface while the serial communication interface is in the address initialization mode.

14. The motor drive circuit of claim 7, wherein, while in the address initialization mode, the control circuitry is configured to disregard the signal at the data input terminal until the signal at the drive signal input terminal is activated.

15. A traction inverter, comprising:
a plurality of power transistors configured to drive an electric motor;
a plurality of gate drivers, each of the gate drivers connected to a control terminal of one of the power transistors; and
a controller comprising a plurality of motor drive terminals, each of the motor drive terminals connected to a drive signal input terminal of one of the gate drivers;
wherein each of the gate drivers comprises a serial communication interface coupled to the controller, the serial communication interface comprising:
a data input terminal; and
control circuitry configured to:
enter an address initialization mode during initialization of the gate driver;
remain in the address initialization mode until a signal received at the drive signal input terminal is activated and thereafter inactivated; and
while in the address initialization mode, assign a value received via the data input terminal to be an address of the serial communication interface.

16. The traction inverter of claim 15, wherein the control circuitry is configured to apply the signal at the drive signal input terminal to enable operation of the serial communication interface during the address initialization mode.

17. The traction inverter of claim 15, wherein the serial communication interface comprises a select terminal coupled to the controller, and the control circuitry is configured to apply the signal at the select terminal to enable operation of the serial communication interface after termination of the address initialization mode.

18. The traction inverter of claim 17, wherein the control circuitry is configured to enable operation of the serial communication interface responsive to receipt, via the data input terminal, of an address value that matches the address assigned to the serial communication interface.

19. The traction inverter of claim 15, wherein the control circuitry is configured to transition from the address initialization mode to an operation mode responsive to assignment of the address.

* * * * *